United States Patent [19]

Green

[11] 4,103,157
[45] Jul. 25, 1978

[54] HIGH SPEED PHOTODETECTOR AND SYSTEM

[75] Inventor: Samuel I. Green, St. Louis County, Mo.

[73] Assignee: McDonnell Douglas Corporation, St. Louis, Mo.

[21] Appl. No.: 765,728

[22] Filed: Feb. 4, 1977

[51] Int. Cl.² .............................................. H01J 5/02
[52] U.S. Cl. ................................................... 250/239
[58] Field of Search ................ 250/211 R, 211 J, 215, 250/216, 239; 357/30; 339/94 L, 94 C, 91 L

[56] References Cited

U.S. PATENT DOCUMENTS

| | | | |
|---|---|---|---|
| 3,668,612 | 10/1974 | Nepovim | 339/94 C |
| 3,842,262 | 10/1974 | Heitman et al. | 250/239 |
| 3,870,878 | 3/1975 | Walter et al. | 250/239 |

Primary Examiner—David C. Nelms
Attorney, Agent, or Firm—Gravely, Lieder & Woodruff

[57] ABSTRACT

A photodetector capable of achieving an extremely high speed of response includes a Shottky barrier semiconductor diode in unpackaged chip form and a mount in which the diode is installed such that a photosensitive region on the diode is exposed forwardly toward the source of light which is to be analyzed. The mount serves to connect the diode with a source of bias voltage and also with a sampling oscilloscope, and it includes a parallel plate capacitor across which the bias voltage is applied. The center plane of this capacitor is located within 0.30 inch and preferably within 0.10 inch of the exposed photosensitive surface on the diode chip. The diode chip, constitutes a very high impedance in the circuit, and when illuminated by a light pulse, generates a signal in the form of a current which flows through the circuitry to the oscilloscope where the signal is displayed as a waveform. This signal is partially reflected at discontinuities in the circuitry, and the major discontinuity is the capacitor across which the bias voltage is applied. The reflected portion of the signal is re-reflected at the diode chip and follows the original signal with a net time delay equal to the round trip time between the photodiode and the capacitor. Further reflections of rapidly decaying intensity likewise occur, and with a conventional mounting all of the reflections, and particularly the first, significantly distort the trailing portion of the waveform. However, since the distance between the diode chip and the capacitor of this mount is so short, the reflected signal is close enough in time to the original signal to be completely embodied within the waveform of the original signal when it is displayed on the oscilloscope. Therefore, the reflection does not distort the waveform portraying the original signal. Rise times as short as 50 psec may be resolved with the photodetector.

14 Claims, 7 Drawing Figures

HIGH SPEED PHOTODETECTOR AND SYSTEM

BACKGROUND OF THE INVENTION

This invention relates in general to photosensitive detectors and in particular to a detector for sensing and analyzing light pulses having extremely short durations and rise times.

Some technologies utilize light pulses of extremely short duration and in order to progress in these technologies one must be capable of analyzing these pulses to ascertain their intensity, duration, build-up and decay characteristics, and the like. Detection and analysis of high speed optical events is most important in laser technology, particularly in the field of laser communications and laser fusion. In these fields, laser pulses having rise times less than 50 picoseconds (a picosecond is one trillionth or $10^{-12}$ of a second) are encountered. Of course, if a photodetector has a response time substantially in excess of the rise time for the light pulse, it is incapable of resolving the light pulse with any measure of precision and a meaningful analysis is not possible.

Texas Instruments markets a packaged photodetector diode known as the TIXL-55 photodiode, and this diode is actually an assembly containing not only a silicon avalanche photodiode, but also a so-called package in which the diode is housed and connections to it are made. This coaxial "pill" package consists essentially of a tubular housing, a lensed window at the end of the housing, and terminals on the housing. In order to use the TIXL-55 diode for light detection, it must be installed in a fixture or mount, through which it is connected with a bias supply and also with an oscilloscope. The package itself as well as the mount adversely affect the speed of response, since they cause the oscilloscope to display distorted images of the actual waveform for a light pulse. For example, reflections often develop in the electrical circuitry, particularly at the capacitor across which the bias is applied, and these reflections appear as subsequent after pulses on the oscilloscope screen. Sometimes they tend to distort the waveform, with the distortion usually appearing at the end of the waveform, making it appear longer than the optical event it actually portrays. Consequently, such devices have relatively poor resolution. A good mount specifically tailored for the TIXL-55 diode is disclosed in U.S. Pat. No. 3,842,262 issued to James L. Heitman and Earl F. Starr, Jr., on Oct. 15, 1974. Even that mount is incapable of resolving light pulses having rise times shorter than 120 psec, partially due to limitations of the photodiode.

The Rockwell GaAsSb avalanche photodiode is capable of resolving light pulses having rise times as short as 50 psec, but it operates in a narrow spectral range in the vicinity of 1064 nm. Certain high speed vacuum diodes resolve light pulses of equivalent rise times, but these diodes cannot tolerate sufficient operating current to be useful in observing the high average signal levels of many laser devices, such as mode locked cw lasers.

SUMMARY OF THE INVENTION

One of the principal objects of the present invention is to provide a photodetector capable of detecting and resolving light pulses of extremely short duration, and having rise times as short as about 50 psec. Another object is to provide a photodetector which provides a reasonably accurate representation of short light pulses, with the representation not being distorted by reflections in the circuitry. A further object is to provide a photodetector which utilizes a single semiconductor diode chip. An additional object is to provide a detector which is simple in construction and easy to manufacture. Still another object is to provide a photodetector which operates in a wide spectral range of light. Yet another object is to provide a mount suitable for an unpackaged high speed photodiode or photodetector chip so as to eliminate packaging parasitics associated with conventional packaged photodiodes. These and other objects and advantages will become apparent hereinafter.

DESCRIPTION OF THE DRAWINGS

In the accompanying drawings which form part of the specification and wherein like numerals and letters refer to like parts wherever they occur.

DETAILED DESCRIPTION

Figure 1:
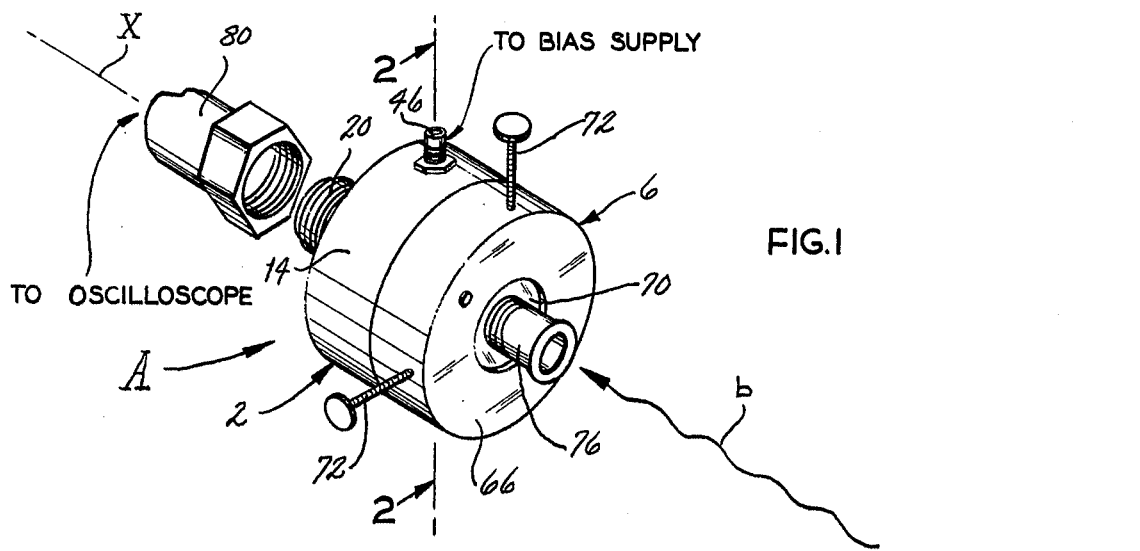
FIG. 1 is a perspective view of the high speed photodetector of the present invention.
Figure 6:
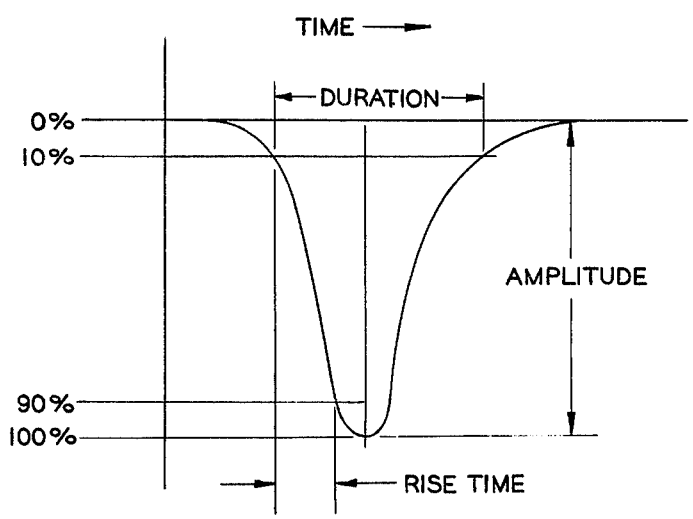
FIG. 6 is a view of a typical waveform produced by the detector.

Referring now to the drawing (FIG. 1), A designates a high speed photodetector capable of detecting fast pulsed laser and other light signals so that those signals may be observed on an oscilloscope screen. Indeed, the speed of response for the detector A is so fast that it is capable of detecting laser signals having rise times as short as about 50 psec. The expression rise time in this connection means the time required for the intensity of the pulse to rise from 10% to 90% of maximum intensity (FIG. 6). The term duration means the length of the pulse measured at 10% of its maximum intensity, that is, between the 10% point on the rise and the 10% point on the decay. Basically, the detector A includes a mount 2, a photodiode 4 on the mount 2, and a lens assembly 6 connected to the mount 2 such that a laser beam $b$ is focused on the photodiode 4.

The mount 2 provides the detector A with its high speed capabilities and includes (FIG. 2) a base 10 formed in a cylindrical configuration from a good electrical conductor such as aluminum. The base 10 has a recess 12 opening out of its forward end, that is, the end which is directed toward the source of the light beam $b$, and the recess 12 is likewise of cylindrical configuration. As a consequence, the base 12 has an annular side wall 14 and a flat back wall 16, the latter of which is provided with a centered axial bore 18. The base 10, the cylindrical side wall 14, and the axial bore 18 all have a common axial center line, and that line forms the optical axis X of the detector A. The mount 2 must be positioned such that the optical axis X coincides with the axis of the light beam $b$.

Projecting rearwardly from base 10 is a signal connector 20 (FIG. 2) including a tubular shank 22 provided with a flange 24 which abuts the back wall 16 around the axial bore 18 therein. The tubular shank 22 is formed from a good conductor such as brass, and may be derived from a conventional OSM connector of the type used for connecting coaxial transmission lines to various devices. The hollow interior of the shank 22 contains a tubular insulator 28 which extends forwardly through the bore 18 in the base 10 and into the recess 12 of the base 10. Indeed, the forward end of the insulator 28 is squared off and located about 0.10 inch (in one embodiment) beyond the front face of the back wall 16. The insulator 28 in turn contains a center pin 30 which is captivated therein in a centered disposition and is formed from a good electrical conductor such as brass. The forward end of the pin 30 is squared off and flush with the squared off forward end of the insulator 28, while the rear end is slotted to receive a mating connector element on a coaxial transmission line. The photodiode 4 mounts on the squared off forward end of pin 30 along the optical axis X. Its width is less than the diameter of the pin 30.

The forward face of the back wall 16 on the base 10 is covered by a dielectric material 34 (FIG. 2) which may be an adhesive backed Mylar tape having a thickness of about 0.002 inch. The dielectric material 34 has a center hole to accommodate the protruding forward end of the tubular insulator 28 and four holes to accommodate machine screws, and is itself covered by a cover plate 36 which likewise has a center bore 38 into which the protruding portion of the tubular insulator 28 fits. The bore 38 does not extend completely through the cover plate 36, but instead terminates at a thin lip 40 having a circular aperture 42 (FIGS. 2–4) centered in it. The center of the aperture 42 lies along the optical axis X, while the diameter of the aperture 42 is slightly larger than the diameter of the conducting pin 30 so that the diode 4 and the surrounding portion of the pin 30 are exposed forwardly through the aperture 42. The cover plate 36, the dielectric material 34, the back wall 16 of the base 10, and the flange 24 of the connector body 22 are all clamped securely together by nylon machine screws 44 which pass through the plate 36, the dielectric material 34, and the back wall 16, and thread into the flange 24. The cover plate 36 and the underlying back wall 16 together with dielectric material 34, which is interposed between them, constitute a parallel plate capacitor 45, the capacitance of which should be between 30 pF and 1000 pF and is typically about 100 pF.

In addition to the signal connector 20, the mount 2 is further provided with a bias connector 46 (FIG. 2) including a brass shank 48 which fits through the annular side wall 14 and has a flange 49 at the inner surface of the wall 14. The connector 64 is held firmly in place by a brass nut 50 which threads down over the shank 48 and bears against the outer surface of the wall 14. The shank 48 contains an insulator 52 and a brass center pin 54 which extends through the insulator 52 and is electrically isolated from the base 10 by the insulator 52. The center pin 54 is electrically connected to the cover plate 36 through a wire 56 having its one end soldered to the inner end of the pin 54 and its other end soldered to solder lug 43 which is compressed against the cover plate 36 underneath the head of one of the nylon machine screws 44. The wire 56 is encircled by ferrite beads 58 which function as a filter to eliminate noise from the electrical circuitry. Connected between the cover plate 36 and the flange 49 of the bias connector 46 is a chip capacitor 60 which should have a capacitance between 0.001 $\mu$F and 1 $\mu$F and typically 0.03 $\mu$F.

Figure 3:
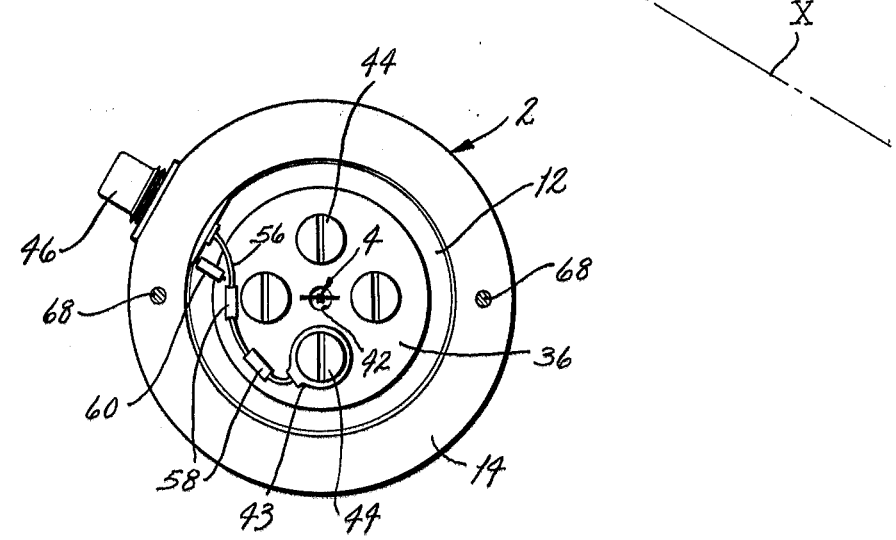
FIG. 3 is a sectional view taken along line 3—3 of FIG. 2.
Figure 4:
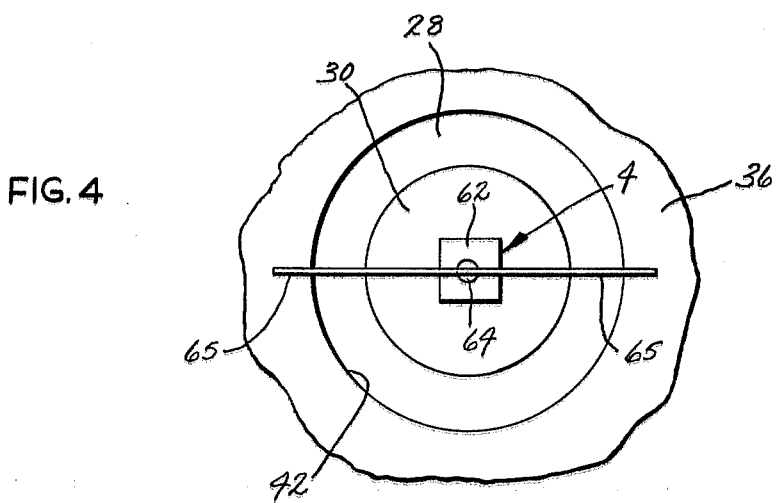
FIG. 4 is an enlarged plan view of the diode and the surrounding structure.
Figure 2:
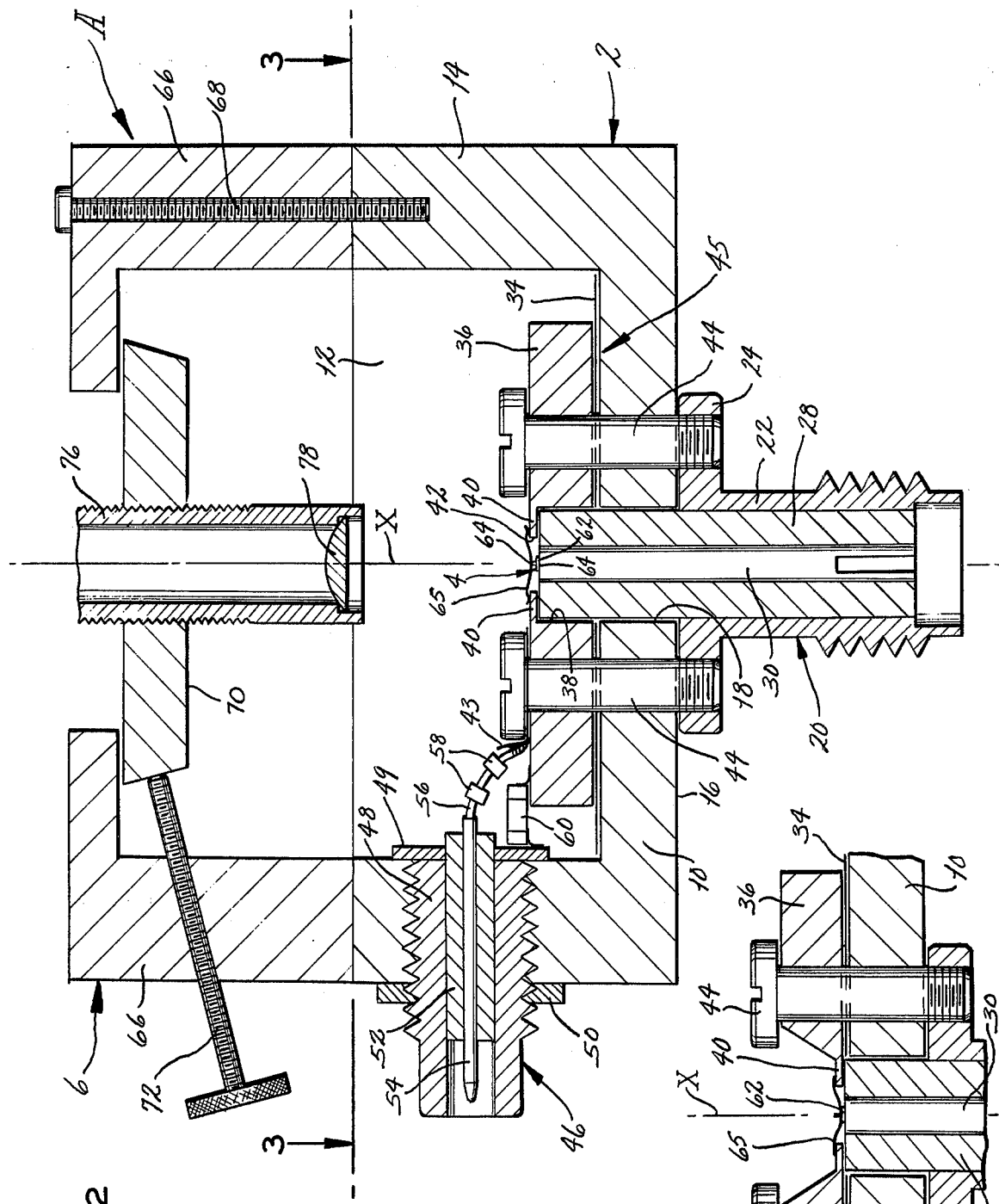
FIG. 2 is a sectional view taken along line 2—2 of FIG. 1.

The photodiode 4 mounts on the end of the conductor pin 30 for the signal connector 20 where it is exposed through the circular aperture 42 in the lip 40 of the cover plate 36 (FIGS. 2–4). It should have a low minority carrier storage time, and from the standpoint of photosensitivity it should have an extremely fast speed of response. A Shottky barrier-diode is well suited for use as the photodiode 4. Shottky barrier-diodes are sold for high speed switching purposes and are normally packaged in glass enclosures which are rendered opaque by suitable coatings to eliminate reverse leakage of current due to the photosensitivity. Thus, heretofore the photosensitivity of the Shottky barrier-diode was considered a detriment. A Shottky barrier-diode which is well suited for use as the photodiode 4 is marketed by Hewlett Packard under the designation HP 5082-0024. This diode is unpackaged, that is, in chip form, and is designed for use in hybrid microcircuits.

The photosensitive diode 4 is a square chip 62 of semiconductor material which measures 0.015 inch by 0.015 inch and is 0.005 inch thick. The back or bottom side of the chip 62 is prepared with gold to be a contact or rear terminal over its entire area, and this terminal is connected directly to the squared off forward end of the center pin 30 for the signal connector 20, so that the chip 62 is positioned firmly on the pin 30 with its front face a very small distance from the center plane of the dielectric material 34. That distance in this case is 0.10 inch. The attachment may be by solder or by an electrically conductive epoxy. The front or top side of the semiconductor chip 62 has a central circular gold contact terminal 64 which is 0.0035 inch in diameter. It is a feature of the Hewlett Packard 5082-0024 Shottky barrier-diode and other such diodes that an annular region around the periphery of the contact 64 is photosensitive with extremely high speed of response. The front terminal 64 has a fine gold wire 65 which is thermal compression bonded to it at the midpoint of the wire 65 so that the wire 65 radiates from the chip in two directions. The fine wire 65, which has a diameter of 0.0007 inch, extends across the aperture 42 in the cover plate 36 and is attached to the lip 40 of the plate 36 by thermal compression bonding. The wire 65 does create an inductance in the circuit, but the presence of the overhanging lip 40 requires only a very short length of wire 65 and thereby reduces the inductance to a minimum. Furthermore, the wire 65 is in effect two parallel leads extending between the diode terminal 64 and the cover plate 36. Two inductances in parallel, of course, create a total inductance which is less by half than either one of the inductances.

The lens assembly 6 (FIGS. 1 and 2) attaches to the forward end of the mount 2 and covers the end of the recess 12. It includes a housing 66 that is attached to the front end of the annular side wall 14 for the base by means of machine screws 68 which thread into the side wall 14. The housing 66 contains a collar 70 (FIG. 2) which is generally centered with respect to the optical axis X, but its radial position is adjustable by two adjusting screws 72 which are threaded through the housing 66. In order to maintain the collar 70 against the ends of the screws 72, the housing 66 is provided with a spring loaded pin (not shown) which bears against the collar 70. Threaded through the collar 70 is a lens barrel 76 which contains a lens 78 for focusing the beam b of light on the diode chip 62. The lens 78 is moved toward and away from the diode chip 62 by rotating the threaded lens barrel 76, while radial translation is effected by rotating the adjusting screws 72. Thus, by rotating the lens barrel 76 it is possible to focus the beam b precisely at the plane of the forward surface of the diode chip 62, and by manipulating the adjusting screws 72 it is further possible to bring the focused spot onto the photosensitive region of the diode chip 62, that is, onto the circular region surrounding the front terminal 64.

Figure 5:
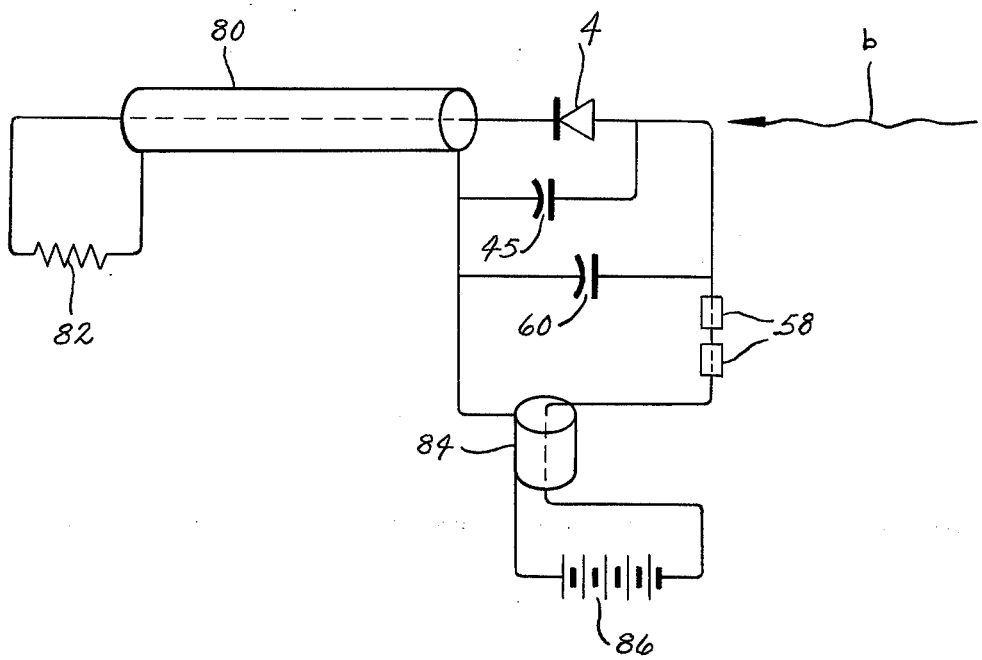
FIG. 5 is a schematic view of the electrical circuit for the photodetector, with the schematic including the bias supply, the oscilloscope, and the coaxial transmission line with which the detector is used.

The signal connector 20 has a coaxial transmission line 80 (FIG. 5) connected to it with the conductive core of that line being in contact with the center pin 30 and the encircling conductor being in contact with connector body 20. The opposite end of the transmission line is connected to a sampling oscilloscope 82. Oscilloscopes of this nature are capable of displaying repetitive signals of extremely short duration, and some are capable of resolving signals having rise times as short as 20 psec. A Tektronix oscilloscope having a 30 psec time Tektronix S6 sampling head is ideally suited for use as the oscilloscope 82. The characteristic impedance of the transmission line 80 must match that of the oscilloscope 82. Usually both are 50 ohms.

The bias connector 46 is connected by means of a shielded cable 84 to a direct current bias voltage source 86 (FIG. 5) which is capable of supplying a voltage slightly below the reverse breakdown voltage of diode 4. In this regard, the positive terminal of the bias source 86 is connected to the base 10 of the mount 2 by means of the shielded cable 84 and the flanged shank 48 of the bias connector 46, while the negative terminal is connected directly to the front terminal 64 of the diode 4, by way of the shielded cable 84, the center pin 54 of the bias connector 46, the wire 56, the coverplate 36, and the gold wire 65.

The circuit in which the photodetector A is utilized (FIG. 5) is such that the diode 4, the oscilloscope 82, and the coaxial transmission line 80 are all in series between the terminals of the direct current bias voltage source 86, the last of which is connected into the circuit such that it provides a reverse bias for the diode 4. The two capacitors 45 and 60 are provided to deliver stored charge at bias potential to the photodiode via a low inductance path. The former maintains the high frequency response above 100 MHz, and the latter maintains the midband frequency response down to about 1 MHz. The external bias source is readily able to extend the response from 1 MHz down to direct current.

In operation, a pulse of light in the form of the beam b passes through the lens 78 which focuses the beam b on the diode chip 62, or more precisely on that portion of the forward surface of the diode chip 62 which is located immediately adjacent to the periphery of terminal 64. This annular area constitutes the photosensitive region since the center of the forward face is obscured by the terminal 64 and the device is only photosensitive in close proximity to terminal 64. The diode chip 62 constitutes a very high impedance, but when illuminated by the light, it generates a current which, of course, flows through the circuit. Typically, the beam b constitutes a train or series of identical pulses which are spaced at equal intervals, and each pulse generates a pulse of current which passes to the oscilloscope 82 where it is displayed in terms of its amplitude and duration. Thus, by observing the screen of the oscilloscope 82, it is possible to observe the rise or build-up and fall or decay of the optical pulse train. The detector will respond faithfully to any time varying optical signal. Repetitive signals are required only because a sampling oscilloscope is used to observe the resultant signals.

Since the reverse biased photodiode 4 is almost an ideal current source and, therefore, approaches being an infinite impedance or total break in the circuit, signals generated by it and sent down the transmission line will be reflected back to the diode 4 from discontinuities in the transmission line or from an imperfect load termination in the output circuitry, and those reflections will cause a time-delayed interfacing signal on the oscilloscope 82. The load termination is eliminated as a source of reflection by matching the impedance of the oscilloscope 82 with that of the coaxial line 80. Both are normally 50 ohms. This leaves the point at which the bias voltage is applied as the greatest remaining transmission line discontinuity in the circuit since virtually all high speed photodetectors require an applied bias potential in order to achieve high speed. That point is the high frequency capacitor 45 formed by the dielectric material 34 interposed between the parallel coverplate 36 and back wall 16. More specifically, when a signal generated at the photodiode 4 travels through the circuit toward the oscilloscope 82, it passes the discontinuity formed by the capacitor 45. A portion of the signal is reflected back to the photodiode 4, while the major portion continues on to the oscilloscope 82. The portion reflected back to the photodiode 4 is totally re-reflected upon reaching the photodiode 4 since the photodiode 4 appears as a high impedance. The major portion of the re-reflected signal reaches the oscilloscope 82 with a net time delay equal to the round trip time between the photodiode 4 and the bias application point, while a minor portion is again reflected back towards the diode 4 contributing to a signal which arrives at the oscilloscope 82 with twice the time delay of the first reflected pulse. As a result smaller signals occur at higher integral multiples of the basic delay time. Thus, the combination of a transmission line with a high impedance signal source at one end, a perfect termination at the other, and a discontinuity in between results in a train of decaying equally spaced pulses for each initial signal pulse. Depending on the individual case, this can result in discrete after pulses, a fall or decay which resembles a staircase, or an extended pulse tail due to the superposition of the multiple reflected pulses at the oscilloscope input. By making the bias insertion capacitor 45 thin and non-inductive, the fraction of the signal energy reflected is caused to be smaller so that this reflected pulse train decays to insignificance in a fewer number of reflections. By making the distance from the photodiode 4 to the bias application point as small as possible, the round trip time delay, which is the time between reflected pulses, is caused to be small so that the reflected pulse train decays to insignificance in the shortest possible time. Application of these two guidelines is essential to achieve the fastest speed of response in a detector mount wherein it is desired that the rise and fall times be identical, for it is the fall of the pulse waveform which is extended and distorted by imperfect mounting schemes.

In an application where it is known that the photodiode, the laser pulse, the available oscilloscope, or some combination of these possess an inherent slowness which limits speed of response to greater than 150 ps, the distance from the photodiode to the bias application point may be as great as 0.30 inches with no discernable degradation. However, for the ultimate resolution which can be achieved with present instrumentation, it is essential to maintain this dimension at under 0.12 inches and preferably less. In the present design which is presented as an application of the above guidelines, this dimension is just under 0.10 inches and is readily reducible to less than 0.04 inches by simply making the cover plate 36 the appropriate thickness. The round trip delay time between the bias application discontinuity and the photodiode 4, and hence the time between the signal pulse and the first post pulse is 24 psec in the present design. The duration of the reflection is equal to the duration of the signal pulse, so that several post pulses may be unresolvable within a relatively narrow laser pulse of 150 psec duration. Post pulses spaced 24 psec apart cannot be resolved with available 30 psec rise time sampling oscilloscopes.

Since the oscilloscope 82 is known to have a rise time of 30 psec, it is capable of resolving signals having rise times of 30 psec or more. When coupled with the mount 20, rise times as short as about 50 psec have been observed over a band of wave lengths including 1064 nm and 532 nm which spans much of the visible and near infra red range of radiation. This means that the rise time of the diode 4 is no greater than 50 psec or the rise time of the light pulse utilized in the measurement was no greater than 50 psec, or that the combined rise times are not greater than 50 psec. No other detector has the capability of observing such a short rise time over a wide spectral band.

To render a greater useable surface area of the chip 62 photosensitive, the forward contact 64 may be made from a film of gold thin enough to be transparent.

Figure 7:
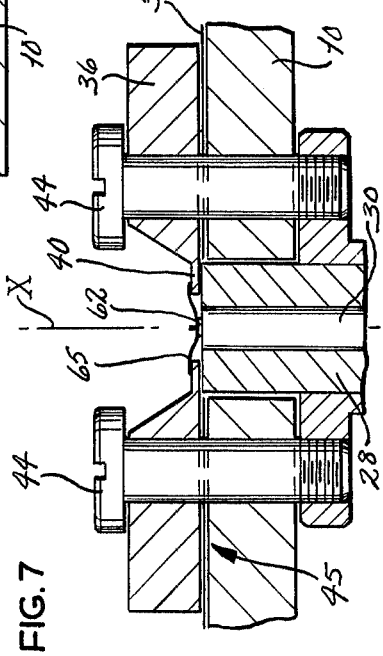
FIG. 7 is a fragmentary sectional view of a modified mounting for diode.

One way to achieve a significant reduction in the remaining distance between the chip diode 62 and the center plane of the capacitor 45 amounts to what might be considered an inversion of the cover plate 36 (FIG. 7). Actually the cover plate 36 has its lip 40 at its back surface instead of its front surface. The tubular insulator 28 and the center pin 30 are of lesser length so that their squared off end faces lie just behind the back surface of the cover plate. The round trip time delay for this configuration is significantly less than 1 psec since the discontinuity becomes comparable to dielectric thickness.

This invention is intended to cover all changes and modifications of the example of the invention herein chosen for purposes of the disclosure which do not constitute departures from the spirit and scope of the invention.

What is claimed is:

1. A detector for sensing light pulses, said detector comprising: a metal base; a metal coverplate overlying the base and having a forwardly presented aperture therein; a dielectric material interposed between the coverplate and the base such that the dielectric material together with the base and coverplate form a parallel plate capacitor; a conductor extended through the base and into the coverplate and having its forward end at the aperture in the coverplate; a photosensitive diode in unpackaged chip form mounted on the forward end of the conductor and having a forwardly presented photosensitive surface which is exposed through the aperture, the diode further having first and second terminals with the first terminal being electrically connected directly to the conductor and the second terminal being electrically connected to the cover plate, a reversely biasing potential being applied to the diode across the parallel plate capacitor, whereby when a light beam illuminates the photosensitive surface of the diode, the diode will produce a signal in the form of an electrical current which may be analyzed with an oscilloscope connected to the conductor and base.

2. A detector according to claim 1 wherein the distance between the forwardly presented photosensitive surface of the diode and the center plane of the dielectric material does not exceed about 0.30 inch and is minimized as a design criteria to a degree consistent with the desired speed of response.

3. A detector according to claim 1 wherein the front terminal of the diode is connected to the coverplate by at least two wires which extend through the aperture in the coverplate, whereby the inductances of the wires are in parallel so as to minimize the adverse effect of parasitic reactance in the high frequency circuit.

4. A detector according to claim 3 wherein the conductor is a pin and is isolated from the base and the coverplate by a tubular insulator which surrounds it and likewise extends into the coverplate; and wherein the coverplate has a lip which extends over the forward end of the insulator and surrounds the aperture so that the wires are as short as possible and their inductances are minimized.

5. A detector according to claim 3 wherein the first terminal of the diode is presented rearwardly toward the pin and is connected to the end of the pin, the second terminal is presented forwardly, and the photosensitive surface is located at the periphery of the second terminal.

6. A detector according to claim 1 and further comprising a lens translatable in three dimensions positioned in front of the diode to focus and to position the beam of light on the photosensitive surface of the diode.

7. A detector according to claim 1 wherein the photosensitive diode is a Shottky barrier diode having an extremely fast speed of response to light pulses due to the very short minority carrier lifetime.

8. In combination with a direct current voltage source and an oscilloscope having a coaxial transmission line leading from it, a detector for sensing a beam of light, said detector comprising: a parallel plate capacitor including first and second metal plates and a dielectric material interposed between the plates, the direct current voltage source being connected across the metal plates and the outer conductor of the coaxial transmission line being connected to the first plate; and a photosensitive diode positioned near the dielectric material of the capacitor and having a photosensitive region and a pair of terminals, the diode being oriented such that its photosensitive region is presented toward the beam of light, whereby the beam of light illuminates the photosensitive region, the one terminal of the diode being connected to the second parallel plate, the other terminal of the diode being connected to the center terminal of the coaxial line, the photosensitive region of the diode not being more than about 0.30 inch from the center plane of the dielectric material.

9. The combination according to claim 8 wherein the diode is connected to the second parallel plate and to the center terminal of the coaxial line such that it is reversely biased.

10. The combination according to claim 8 wherein the diode is in unpackaged chip form.

11. The combination according to claim 10 wherein the diode is surrounded by the second plate of the capacitor.

12. The combination according to claim 11 wherein the diode is mounted on a conductive pin which extends through the first plate of the capacitor and terminates within the second plate; wherein the diode is connected to the other terminal of the coaxial line through the conductive pin; and wherein the second plate has an aperture in it through which the photosensitive region of the diode is exposed to the light beam.

13. The combination according to claim 12 wherein the one terminal of the diode is connected to the second plate by at least one wire.

14. The combination according to claim 13 wherein the conductive pin is isolated from the plates by a tubular dielectric insulator and the other plate has a lip extended over the tubular insulator with the aperture for that plate being at the lip, the wire being connected to the lip so that it is of minimum length and its inductance is reduced to a minimum.

* * * * *